(12) United States Patent
Kuo et al.

(10) Patent No.: US 8,987,016 B2
(45) Date of Patent: Mar. 24, 2015

(54) EFFICIENT AND DIRECTED NANO-LIGHT EMITTING DIODE, AND METHOD FOR MAKING SAME

(75) Inventors: Mei-Ling Kuo, Troy, NY (US); Shawn-Yu Lin, Niskayuna, NY (US); Yong Sung Kim, Latham, NY (US); Mei-Li Hsieh, New Taipei (TW)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 13/816,628

(22) PCT Filed: Aug. 16, 2011

(86) PCT No.: PCT/US2011/047923
§ 371 (c)(1),
(2), (4) Date: Apr. 24, 2013

(87) PCT Pub. No.: WO2012/024299
PCT Pub. Date: Feb. 23, 2012

(65) Prior Publication Data
US 2013/0221323 A1 Aug. 29, 2013

Related U.S. Application Data

(60) Provisional application No. 61/401,603, filed on Aug. 16, 2010.

(51) Int. Cl.
*H01L 21/00* (2006.01)
*H01L 33/06* (2010.01)
*H01L 33/20* (2010.01)
(Continued)

(52) U.S. Cl.
CPC ............... *H01L 33/06* (2013.01); *H01L 33/20* (2013.01); *H01L 33/005* (2013.01); *H01L 33/007* (2013.01); *B82Y 40/00* (2013.01);
(Continued)

(58) Field of Classification Search
CPC ....... H01L 33/06; H01L 33/20; H01L 33/005; H01L 33/007; B82Y 10/00; B82Y 20/00; B82Y 40/00; Y10S 977/755; Y10S 977/95; Y10S 997/89
USPC ................ 257/13, 14, 79, 94; 438/22, 35, 47; 977/950, 755, 890
See application file for complete search history.

(56) References Cited

U.S. PATENT DOCUMENTS

| | | | |
|---|---|---|---|
| 6,531,030 | B1 | 3/2003 | Nakajima |
| 2004/0252737 | A1 * | 12/2004 | Yi et al. ......................... 372/43 |
| 2006/0054905 | A1 | 3/2006 | Schwach et al. |
| 2006/0189018 | A1 | 8/2006 | Yi et al. |
| 2007/0246700 | A1 | 10/2007 | Park |
| 2010/0051986 | A1 | 3/2010 | Min et al. |

(Continued)

OTHER PUBLICATIONS

International Search Report for PCT/US2011/047923 dated Dec. 12, 2011.

*Primary Examiner* — Nikolay Yushin
(74) *Attorney, Agent, or Firm* — Heslin Rothenberg Farley & Mesiti P.C.

(57) ABSTRACT

The invention relates to light-emitting devices, and related components, systems and methods. In one aspect, the present invention is related to light emitting diode (LED) light extraction efficiency. A non-limiting example, the application teaches a method for improving light emitting diode (LED) extraction efficiency, by providing a nano-rod light emitting diode; providing quantum wells; and reducing the size of said nano-rod LED laterally in the quantum-well plane (x and y), thereby improving LED extraction efficiency.

12 Claims, 6 Drawing Sheets

(51) Int. Cl.
*H01L 33/00* (2010.01)
*B82Y 40/00* (2011.01)

(52) U.S. Cl.
CPC ............ *Y10S 977/755* (2013.01); *Y10S 977/89* (2013.01); *Y10S 977/95* (2013.01)
USPC .............. 438/22; 977/755; 977/890; 977/950

(56) References Cited

U.S. PATENT DOCUMENTS

2010/0132887 A2    6/2010  Donnelly et al.
2012/0025232 A1*   2/2012  Gwo et al. ...................... 257/94

* cited by examiner

EFFICIENT AND DIRECTED NANO-LIGHT EMITTING DIODE, AND METHOD FOR MAKING SAME

CROSS REFERENCE TO RELATED APPLICATION

This application is the National Phase filing of International Application No. PCT/US11/47923, filed Aug. 16, 2011, which claims priority to U.S. Provisional Application No. 61/401,603, filed Aug. 16, 2010. The entire content of each prior application is hereby incorporated by reference.

STATE AND FEDERAL FUNDED RESEARCH

The invention described herein was made with support of the National Service Foundation under Award Number EEC-0812056. The U.S. Government may have certain rights to this invention.

TECHNICAL FIELD

The invention relates to light-emitting devices, and related components, systems and methods. In one aspect, the present invention is related to light extraction efficiency of a light emitting diode (LED).

BACKGROUND OF THE INVENTION

A light emitting diode (LED) is a semiconductor device that emits light in a stimulated manner. This effect is a form of electroluminescence. LEDs can provide light in a more efficient manner than an incandescent and/or a fluorescent light source. The relatively high power efficiency associated with LEDs has created an interest in using LEDs to displace conventional light sources in a variety of lighting applications, including for example as traffic lights and for illuminating cell phone keypads and displays.

An LED is comprised of a chip of semiconducting material impregnated, or doped, with impurities to create a structure called a pn junction. When biased forwardly, electrons are injected into the junction from the n-region and holes are injected from the p-region. The electrons and holes release energy in the form of photons as they recombine. The wavelength of the light, and therefore its color, depends on the bandgap energy of the materials forming the pn junction.

As semiconductor materials have improved, the efficiency of semiconductor devices has also improved and new wavelength ranges have been used. Gallium nitride (GaN) based light emitters are one of the most promising for a variety of applications, in part because GaN provides efficient illumination in the ultraviolet (UV) to amber spectrum, when alloyed with varying concentrates of indium (In). However, most of the light emitted within a semiconductor LED material is lost due to total internal reflection at the semiconductor-air interface. Typical semiconductor materials have a high index of refraction, and thus, according to Snell's law, most of the light will remain trapped in the materials, thereby decreasing efficiency.

Typically, an LED is made of multiple layers, with at least some of the layers being formed of different materials. In general, the materials and thicknesses selected for the layers determine the wavelength(s) of light emitted by the LED. In addition, the chemical composition of the layers can be selected to try to isolate injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

Typically, when preparing the LED, the layers of material are prepared in the form of a wafer. These layers are formed using an epitaxial deposition technique, such as metal-organic chemical vapor deposition (MOCVD), with the initially deposited layer being formed on a growth substrate. The layers are then exposed to various etching and metallization techniques to form contacts for electrical current injection, and the wafer is subsequently sectioned into individual LED chips. Usually, the LED chips are packaged.

During use, electrical energy is usually injected into an LED and then converted into electromagnetic radiation (light), some of which is extracted from the LED. A number of references are devoted to the issue of light extraction from light-emitting semiconductor materials. Light extraction can be achieved using geometrical optics effects, for example, using pyramids, outcoupling tapers or textured surfaces, or wave optics effects, for example, using microcavity resonances or photonic crystal extraction. Special growth techniques such as pendeo or cantilever growths or lateral epitaxial overgrowth may also be used to achieve light extraction. However, there have been few recent advances in the field of LED extraction.

Accordingly, there is a need in the art for new light-emitting devices, and related components, systems and methods, and in particular there is a great need in the art for more efficient LEDs and methods for making them.

SUMMARY OF THE INVENTION

The inventors of the instant application have surprisingly discovered that a large increase in light extraction can be achieved due to guided-mode reduction, an embedded emitter design, and an ultra-efficient light out-coupling by the fundamental $HE_{11}$ mode. The complete mode-elimination results in an increase in light extraction efficiency without the use of either a back-reflector or a thin GaN film. The inventors of the instant application also surprisingly discovered that that size-reduction, in the sub-$\lambda$ scales, can be used as a means to modify an LED's radiation pattern, making it more directional.

One aspect of the presently claimed invention is directed to a method for improving light emitting diode (LED) extraction efficiency, said method comprising: providing a nano-rod light emitting diode; providing quantum wells; and reducing the size of said nano-rod LED laterally in the quantum-well plane (x and y), thereby improving LED extraction efficiency.

In one embodiment, the extraction efficiency achieved is from about 60% to about 100%. In another embodiment, the extraction efficiency achieved is from about 60% to about 92%. In another embodiment, the extraction efficiency achieved is 80% or more. In embodiments of the present invention, a back reflector or high reflectance metallic coatings are not used. In one embodiment, the extracting efficiency achieved is about 80% efficiency from the top surface of a nano-rod LED without the use of a back reflector.

In one embodiment of the present invention, the quantum wells are placed inside the nano-rod. In another embodiment, the number of guided modes inside of said nano-rod light emitting diode is decreased. In another embodiment, the guided modes inside of said nano-rod light emitting diode are eliminated. In another embodiment, the rod-diameter is reduced to a sub-λ confinement regime.

In one embodiment, the rod-diameter of the nano-rod light emitting diode is reduced to about 100 nm. In another embodiment, the rod-diameter of the nano-rod light emitting diode is reduced to about 50 nm or less. In another embodiment, the rod diameter of the nano-rod light emitting diode is reduced to about 200 nm and guided mode is reduced to about 3. In one embodiment, the rod diameter of the nano-rod light emitting diode is reduced to about 100 nm and guided mode is reduced to about 1. In a related embodiment, the rod diameter of the nano-rod light emitting diode is reduced to about 50 nm and guided mode is reduced to about 1.

In one embodiment, the transmission is 100% when the rod diameter of the nano-rod light emitting diode is less than 100 nm, with emission wavelength λ~460 μm. In another embodiment, the extraction efficiency is about 80% or more when the rod diameter of the nano-rod light emitting diode is between 60-100 nm, with emission wavelength λ~460 μm. In one embodiment, the radiation pattern of the LED becomes more directional.

One aspect of the presently claimed invention is directed to a method for extracting about 80% efficiency from the top surface of a nano-rod LED without the use of a back reflector, said method comprising: providing a nano-rod light emitting diode; providing quantum wells; and eliminating the guided modes, except for $HE_{11}$ mode, inside of said nano-rod LED.

In one embodiment, eliminating comprises reducing the size of said nano-rod LED laterally in the quantum-well plane (x and y). In one embodiment, the extraction efficiency achieved is from about 60% to about 92%. In one embodiment, the quantum wells are placed inside the nano-rod. In another embodiment, the guided modes inside of said nano-rod light emitting diode are eliminated, except for $HE_{11}$. In another embodiment, the rod-diameter is reduced to a sub-λ confinement regime.

Another aspect of the presently claimed invention is directed to a method for eliminating the guided modes, except for the $HE_{11}$ mode, inside a nano-rod light emitting diode, said method comprising: providing a nano-rod light emitting diode; providing quantum wells, wherein said quantum wells are inside of said nano-rod light emitting diode; and reducing the size of said nano-rod LED laterally in the quantum-well plane (x and y), thereby eliminating the guided modes except for the $HE_{11}$ mode.

One aspect of the presently claimed invention is directed to a method for modifying a light emitting diode's radiation pattern, comprising: providing a nano-rod light emitting diode; providing quantum wells, wherein said quantum wells are inside of said nano-rod light emitting diode; and reducing the rod-diameter of said nano-rod light emitting diode in the quantum-well plane (x and y), thereby modifying a light emitting diode's radiation pattern.

In one embodiment, the said radiation pattern becomes more directional. In another embodiment, the light emitting diode's radiation pattern is modified such that the radiation pattern does not follow the Lambertian pattern of a normal LED, and its angular extend is narrower with a half-power point at θ=35°. In one embodiment, the number of guided modes inside of said nano-rod light emitting diode is decreased. In another embodiment, all the guided modes inside of said nano-rod light emitting diode are eliminated except for the $HE_{11}$ mode.

One aspect of the presently claimed invention is directed to a nano-rod light emitting diode that has quantum wells inside of it and wherein the rod-diameter of the nano-rod light emitting diode is about 200 nm or less. In one embodiment, the present invention is directed to a nano-rod light emitting diode that has quantum wells inside of it and wherein the rod-diameter of the nano-rod light emitting diode is about 150 nm or less. In one embodiment, the present invention is directed to a nano-rod light emitting diode that has quantum wells inside of it and wherein the rod-diameter of the nano-rod light emitting diode is about 100 nm or less. In one embodiment, the present invention is directed to a nano-rod light emitting diode that has quantum wells inside of it and wherein the rod-diameter of the nano-rod light emitting diode is about 50 nm or less.

In one embodiment, the extraction efficiency of the LED is from about 60% to about 100%. In another embodiment, the extraction efficiency of the LED is from about 60% to about 92%. In a related embodiment, the extraction efficiency of the LED is 80% or more. In another embodiment, the extracting efficiency of the LED is about 80% efficiency from the top surface of a nano-rod LED without the use of a back reflector. In yet another embodiment, the rod-diameter of the nano-rod LED is at sub-λ confinement regime.

In one embodiment, the rod-diameter of the nano-rod light emitting diode is about 100 nm. In another embodiment, the rod-diameter of the nano-rod light emitting diode is about 50 nm or less. In yet another embodiment, the rod diameter of the nano-rod light emitting diode is about 200 nm and guided mode is about 3. In another embodiment, the rod diameter of the nano-rod light emitting diode is about 100 nm and guided mode is about 1. In another embodiment, the rod diameter of the nano-rod light emitting diode is about 50 nm and guided mode is about 1. In one embodiment, the transmission is 100% when the rod diameter of the nano-rod light emitting diode is less than 100 nm, with emission wavelength λ~460 μm. In another embodiment, the extraction efficiency is about 80% or more when the rod diameter of the nano-rod light emitting diode is between 60-100 nm, with emission wavelength λ~460 μm. In another embodiment, the radiation pattern of the LED is more directional when compared to a standard LED.

In one embodiment, the maximum extraction efficiency at rod diameter (d) of about 100 nm is from about $C_{ex}$=80% to about $C_{ex}$=100%. In a further embodiment, the maximum extraction efficiency at rod diameter (d) of about 100 nm is about $C_{ex}$=75%. In a further embodiment, the maximum extraction efficiency at rod diameter (d) of about 100 nm is about $C_{ex}$=79%. In a further embodiment, the maximum extraction efficiency at rod diameter (d) of about 100 nm is about $C_{ex}$=83%. In a further embodiment, the maximum extraction efficiency at rod diameter (d) of about 100 nm is about $C_{ex}$=87%. In a further embodiment, the maximum extraction efficiency at rod diameter (d) of about 100 nm is about $C_{ex}$=92%. In a further embodiment, the maximum extraction efficiency at rod diameter (d) of about 100 nm is about $C_{ex}$=96%.

Another aspect of the presently claimed invention is directed to a method for making a nano-rod LED that is reduced in size laterally in the quantum-well plane (x and y), said method comprising: quantizing the guided modes; defining nano-rod pattern by E-beam lithography; depositing Nickel; performing inductively coupled plasma etching; and removing Nickel.

By varying the diameter of rod LED, the enhancement of intensity per effective emitting area is examined. Compared to the nanoscale rod LED, the d=8 μm rod LED is considered as a planar LED with a limited escaping cone and the extraction efficiency of that is 4% in theory (corresponding to right axis). Within the regime 60 nm<d<100 nm (shadow), the highest extraction efficiency was observed. (c) The internal efficiency as a function of diameter d (μm). Red solid line is a guideline. The internal efficiency was deduced from the temperature-dependent PL measurement. It shows the internal efficiency is diameter-independent in the regime d=50 nm to d=8 μm.

Figure 5:
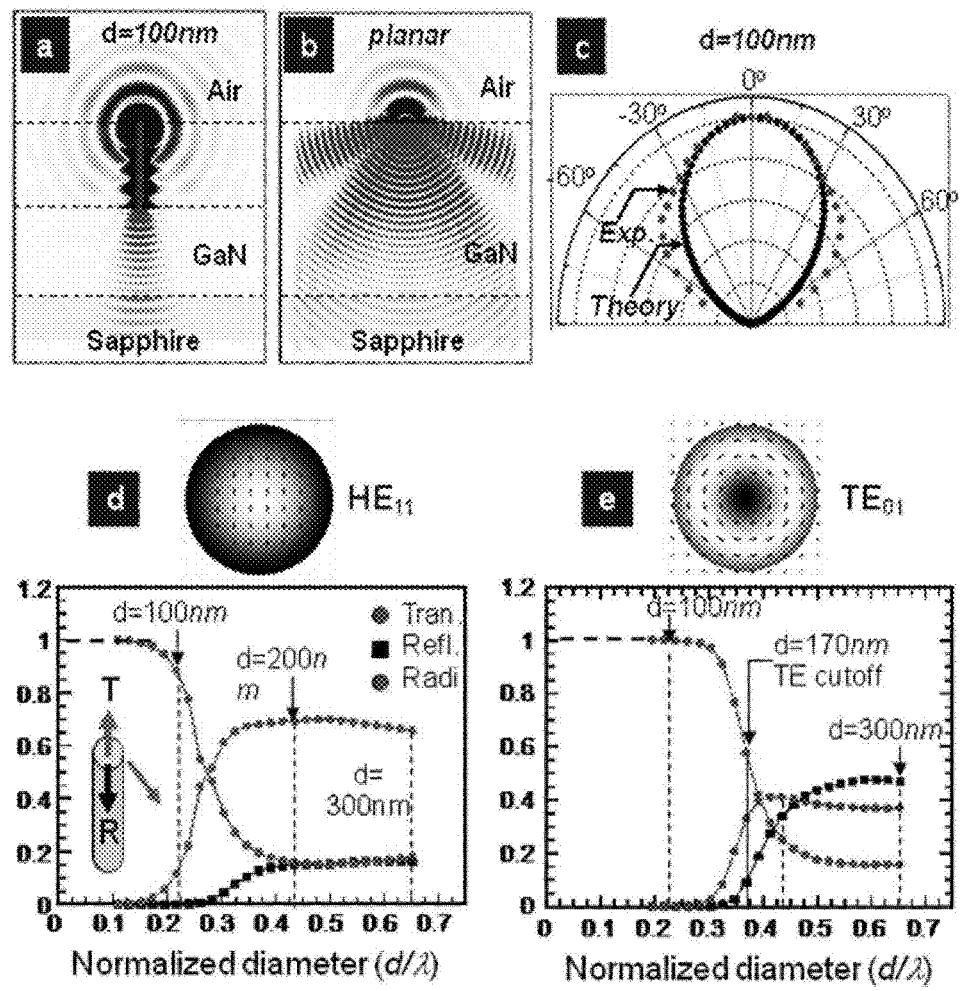

FIG. 5 shows guided mode properties of a nano-rod LED and its far-field radiation pattern. (a) Results of a theoretical computation of the electric field intensity profile of a d=100 nm nano-rod LED; (b) Results of a theoretical computation of the electric field intensity profile of a planar LED; (c) An angular emission plot of a d=100 nm nano-rod LED obtained from an experimental (red outer dots forming oval shape) and a theoretical calculation (black inner dots forming oval shape). (d), (e) Results of calculation of transmittance T (red dot), reflectance R (black square) and radiation amplitude (green dot) for fundamental $HE_{11}$ and $TE_{01}$ guided mode, respectively. The rod-diameter is expressed in a normalized unit, (d/λ).

DETAILED DESCRIPTION

A key to the success of solid-state-lighting is ultra high-efficiency light extraction, (~90%). The present invention is related to nanotechnology, and in particular to LED technology. The inventors of the instant application have discovered processes by which one can manipulate optical modes at nanometer scales. In particular, the inventors of the instant application here report an optically pumped nanorod light-emitting-diode (LED) with an ultra high extraction efficiency of 79% at λ=460 nm without the use of either a back reflector or the thin film technology. This high extraction efficiency was achieved through guided mode-reduction, embedded quantum wells, and ultra-efficient light out-coupling by the fundamental $HE_{11}$ mode. Furthermore, the present invention teaches that size-reduction at nano-scale levels represents a new degree-of-freedom for alternating and achieving a more directed LED emission.

GaN-based light-emitting-diodes (LED) are attractive light sources for illumination purposes due to their compactness, high efficiency and long lifetime. A compact and bright LED is also attractive for emerging bio-sensing and bio-imaging applications. One major factor that contributes to a highly efficient LED is the improvement in internal quantum efficiency. Another factor is the improvement in extraction of light that is otherwise guided (or trapped) inside a high index GaN material. Applicants have identified that one main difficulty associated with efficient light extraction concerns manipulation of the guided modes in a LED structure.

Today, there are two types of surface modified structures that are effective in extracting the trapped LED light. A thin-film, rough-surface LED with a back reflector can have a high extraction efficiency of approximately 80%. The back reflector is to used to re-direct light emission and the roughened surface is used to scatter light from the guided modes into the air. A thin-film, two-dimensional (2D) photonic crystal LED can also give high extraction efficiency (approximately 73%). In this case, the photonic crystal is placed on top of quantum wells ("QW") to diffract LED light from the guide modes into the air. In essence, these are two types of surface modified structures that influence the scattering of LED light.

The thin-film LED geometry plays a major, but different role in improving light extraction. The finite film thickness of about 700-3,000 nm reduces the number of guided modes through size quantization. In particular, thin film LED geometry improves light extraction by reducing the number of guided modes though size quantization along the growth direction (z-direction). However, this design cannot completely eliminate the guided modes, as the film would need to be very thin (about 50-100 nm) and this is not practical for growth and current spreading purposes.

An alternative photonic-crystal approach is to etch 2D holes through the QWs. Because the QW is inside a photonic-crystal, light emission into guided modes could perhaps be eliminated due to a 2D photonic stop gap. However, there are several drawbacks to this design, including that the design has only been demonstrated in the membrane geometry (GaIn- AsP) and with a moderate emission enhancement of 5 times. Applicants believe that surface recombination at the sidewall and other scattering mechanism likely contribute to the limited success of this technique.

In the present invention, the inventors have conceived that the ultimate goal of light extraction is to eliminate the guided modes completely and achieve a near-perfect LED extraction efficiency of about 100%, and a way to achieve this goal. The inventors of the present invention took a different approach to the thin-film technology approach. The present inventors decreased the number of guided modes. Particularly, in the present invention, the inventors decreased the number of guided mode in the lateral direction along the QW plane (i.e. x and y direction) and by etching nano-rods through the QWs. In the lateral size reduction process, guided modes are quantized and the number-of-mode can eventually approach a few and even one. Because the QW is part of a nano-rod, an embedded emitter, light emission can be completely dictated by optical modes inside a nano-rod.

The inventors of the instant application have surprisingly discovered and demonstrated a large increase in light extraction due to guided-mode reduction, an embedded emitter design, and an ultra-efficient light out-coupling by the fundamental $HE_{11}$ mode. The complete mode-elimination results in 79% light extraction efficiency without the use of either a back-reflector or a thin GaN film. It is further taught and demonstrated that size-reduction, in the sub-$\lambda$ scales, can be used as a means to modify a LED's radiation pattern.

A nano-rod LED can be considered as a form of optical fiber but with very small diameter. By reducing the diameter, Applicants teach that it is possible to reduce the number of guided modes. However, theoretically, $HE_{11}$ mode always exists, even as the diameter becomes 0. Therefore, it is not possible to completely eliminate this mode. However, the present invention teaches how one can make it transmit through the top surface of the nano-rod with close to 100% transmission, depending on its diameter (see FIG. 5).

Applicants surprisingly discovered that the transmission can be close to 100% when the diameter becomes less than 100 nm with emission wavelength $\lambda \sim 460$ µm. In one embodiment, the transmission is 100% when the rod diameter of the nano-rod light emitting diode is less than 100 nm, with emission wavelength $\lambda \sim 460$ µm. In one embodiment, the extraction efficiency is about 70% to about 80% when the rod diameter of the nano-rod light emitting diode is between 60-100 nm, with emission wavelength $\lambda \sim 460$ µm. In one embodiment, the extraction efficiency is about 80% to about 90% when the rod diameter of the nano-rod light emitting diode is between 60-100 nm, with emission wavelength $\lambda \sim 460$ µm. In one embodiment, the extraction efficiency is about 90% to about 100% when the rod diameter of the nano-rod light emitting diode is between 60-100 nm, with emission wavelength $\lambda \sim 460$ µm. In another embodiment, the extraction efficiency is about 80% or more when the rod diameter of the nano-rod light emitting diode is between 60-100 nm, with emission wavelength $\lambda \sim 460$ µm.

The inventors of the instant application systematically investigated the impact of mode-reduction on light extraction efficiency. The present application also teaches how to use rod-size, in the sub-$\lambda$ regime, in order to tailor other basic properties of light emission, such as radiation pattern. The complete mode-elimination resulted in about 80% light extraction efficiency from the top surface alone and without the use of a back-reflector. If there is a back reflector, one can change the direction of the light going down inside the nano-rod to the top surface. It is possible to achieve 100% efficiency. The back reflector could be a Bragg reflector or simply a coating of high reflectance metallic materials such as silver or aluminum. Even in the few mode regimes, the present application shows that the nano-sized LED can effectively transmit LED light from guided modes into the air. In certain embodiments of the present invention, a back reflector or high reflectance metallic coatings are not used.

Furthermore, Applicants data show that nano-engineering of the basic photonic modes can be used to tailor the far-field radiation pattern of an LED light. The fundamental $HE_{11}$ mode shows 100% transmission through the top surface, and there is no transmission leakage out through the side wall of the nano-rod. This is because the light is strongly confined in the nano-rod until the light reaches the top surface. Therefore, the radiation does not follow the Lambertian pattern and its angular extend is much narrower with a half-power point at $\theta=35°$.

One goal of light extraction is to eliminate the guided modes completely and achieve a near-perfect LED extraction efficiency of about 100%. The inventors of the instant application have discovered a nano-rod light-emitting-diode (LED) with a high extraction efficiency at $\lambda=460$ nm and a narrow radiation pattern. The single nano-rod was fabricated by etching through the quantum well region, allowing for an effective elimination of those guided modes that trap light. Even in a few mode regimes, the present invention shows that it is possible to effectively couple guided modes out of the LED. The basic optical mode control results in high performance LED with extraction efficiency of about 80% from the top surface without the use of a back reflector. The inventors of the instant application also achieved a much narrower radiation pattern than the Lambertian function.

The instant application teaches a method for improving light emitting diode (LED) extraction efficiency, said method comprising: providing a nano-rod light emitting diode; providing quantum wells; and reducing the size of said nano-rod LED laterally in the quantum-well plane (x and y), thereby improving LED extraction efficiency. By way of practicing the presently taught method, the LED extraction efficiency achieved is from about 60% to about 100%. The LED extraction efficiency was also found to be from about 60% to about 92%. The inventors teach that by practicing the presently taught and claimed method, it is possible to improve the extraction efficiency of the LED to 80% or more. In one embodiment, the extracting efficiency achieved is about 80% efficiency from the top surface of a nano-rod LED without the use of a back reflector.

The quantum wells are placed inside the nano-rod, and the number of guided modes inside of said nano-rod light emitting diode is decreased. In some instances, the guided modes inside of said nano-rod light emitting diode are eliminated. The rod-diameter of the nano-rod light emitting diode is reduced to about 100 nm, or to about 50 nm or less. When the rod diameter of the nano-rod light emitting diode is reduced to about 200 nm, guided mode is reduced to about 3. When the rod diameter of the nano-rod light emitting diode is reduced to about 100 nm, guided mode is reduced to about 1. Similarly, when the rod diameter of the nano-rod light emitting diode is reduced to about 50 nm, the guided mode is also reduced to about 1.

The transmission from the nano-rod LED is 100% when the rod diameter of the nano-rod light emitting diode is less than 100 nm, with emission wavelength $\lambda \sim 460$ µm. The extraction efficiency of the nano-rod LED is about 80% or more when the rod diameter of the nano-rod light emitting diode is between 60-100 nm, with emission wavelength $\lambda \sim 460$ µm. The transmission from the nano-rod LED is 100% when the rod diameter of the nano-rod light emitting diode is about 100 nm or less, with emission wavelength λ~460 μm. By practicing the presently taught methods, the radiation pattern of the LED becomes more directional.

The present application teaches a method for extracting about 80% efficiency from the top surface of a nano-rod LED without the use of a back reflector, said method comprising: providing a nano-rod light emitting diode; providing quantum wells; and eliminating the guided modes, except for $HE_{11}$ mode, inside of said nano-rod LED. Eliminating comprises reducing the size of said nano-rod LED laterally in the quantum-well plane (x and y). The extraction efficiency achieved is from about 60% to about 92%. The quantum wells are placed inside the nano-rod, and the guided modes inside of said nano-rod light emitting diode are eliminated, except for $HE_{11}$. In certain embodiments, the rod-diameter is reduced to a sub-λ confinement regime.

The inventors of the instant application teach a method for eliminating the guided modes, except for the $HE_{11}$ mode, inside a nano-rod light emitting diode, said method comprising: providing a nano-rod light emitting diode; providing quantum wells, wherein said quantum wells are inside of said nano-rod light emitting diode; and reducing the size of said nano-rod LED laterally in the quantum-well plane (x and y), thereby eliminating the guided modes except for the $HE_{11}$ mode.

The inventors of the instant application surprisingly discovered that a nano-rod LED offered a means to control the radiation pattern of LED emission. For example, the inventors showed that the radiation pattern becomes more directional. As such, the present invention is also directed to a method for modifying a light emitting diode's radiation pattern, comprising: providing a nano-rod light emitting diode; providing quantum wells, wherein said quantum wells are inside of said nano-rod light emitting diode; and reducing the rod-diameter of said nano-rod light emitting diode in the quantum-well plane (x and y), thereby modifying a light emitting diode's radiation pattern. In one embodiment, the said radiation pattern becomes more directional.

In other instances, the inventors showed that the light emitting diode's radiation pattern can be modified such that the radiation pattern does not follow the Lambertian pattern of a normal LED, and its angular extend is narrower with a half-power point at θ=35°. By practicing certain embodiments of the present invention, the number of guided modes inside of said nano-rod light emitting diode is decreased. In some cases, all the guided modes inside of said nano-rod light emitting diode are eliminated except for the $HE_{11}$ mode.

The present invention is also directed to a nano-rod light emitting diode that has quantum wells inside of it and wherein its rod-diameter of the nano-rod LED is about 200 nm or less. The extraction efficiency of the LED is from about 60% to about 100%. In the alternative, the extraction efficiency of the LED is from about 60% to about 92%. In the alternative, the extraction efficiency of the LED is from about 79% to about 92%. The extraction efficiency of the LED is 80% or more. In one embodiment, the extracting efficiency of the LED is about 80% efficiency from the top surface of a nano-rod LED without the use of a back reflector.

In one embodiment, the rod-diameter of the nano-rod light emitting diode is about 100 nm. In another embodiment, the rod-diameter of the nano-rod light emitting diode is about 50 nm or less. In yet another embodiment, the rod diameter of the nano-rod light emitting diode is about 200 nm and guided mode is about 3. In another embodiment, the rod diameter of the nano-rod light emitting diode is about 100 nm and guided mode is about 1. In another embodiment, the rod diameter of the nano-rod light emitting diode is about 50 nm and guided mode is about 1. In one embodiment, the transmission is 100% when the rod diameter of the nano-rod light emitting diode is less than 100 nm, with emission wavelength λ~460 μm. In another embodiment, the extraction efficiency is about 80% or more when the rod diameter of the nano-rod light emitting diode is between 60-100 nm, with emission wavelength λ~460 μm. In another embodiment, the radiation pattern of the LED is more directional when compared to a standard LED.

When the nano-rod diameter is reduced to 200 nm, the number of guided modes reduces to 3. Further still, when the nano-rod dimater is reduced to 100 nm, the number of guided modes is reduced to 1. In one embodiment, the transmission is 100% when the rod diameter of the nano-rod light emitting diode is less than 100 nm, with emission wavelength λ~460 μm and where there is no back reflector used. The inventors of the instant application also teach a method for making a nano-rod LED that is reduced in size laterally in the quantum-well plane (x and y), comprising: quantizing the guided modes; defining nano-rod pattern by E-beam lithography; depositing Nickel; performing inductively coupled plasma etching; and removing Nickel.

Thus, the inventors of the instant application have surprisingly discovered that it is possible to completely eliminate TE guided modes inside a nano-rod LED and accomplish an extraction efficiency of about 80% from the top surface without the use of a back reflector or a thin film. The inventors achieved this by placing the quantum wells inside the nano-LED and reduced the rod-diameter to a sub-λ confinement regime (d/λ≤0.20). The inventors of the instant application have also surprisingly discovered new ways to control radiation pattern using a nano-LED.

In one embodiment, the maximum extraction efficiency at rod diameter (d) of about 100 nm is from about $C_{ex}$=79% to about $C_{ex}$=92%. In one embodiment, the maximum extraction efficiency at rod diameter (d) of about 100 nm is from about $C_{ex}$=60% to about $C_{ex}$=92%. In one embodiment, the maximum extraction efficiency at rod diameter (d) of about 100 nm is from about $C_{ex}$=80% to about $C_{ex}$=90%. In another embodiment, the maximum extraction efficiency at rod diameter (d) of about 100 nm is from about $C_{ex}$=80% to about $C_{ex}$=100%. In a further embodiment, the maximum extraction efficiency at rod diameter (d) of about 100 nm is about $C_{ex}$=75%. In a further embodiment, the maximum extraction efficiency at rod diameter (d) of about 100 nm is about $C_{ex}$=79%. In a further embodiment, the maximum extraction efficiency at rod diameter (d) of about 100 nm is about $C_{ex}$=83%. In a further embodiment, the maximum extraction efficiency at rod diameter (d) of about 100 nm is about $C_{ex}$=87%. In a further embodiment, the maximum extraction efficiency at rod diameter (d) of about 100 nm is about $C_{ex}$=92%. In a further embodiment, the maximum extraction efficiency at rod diameter (d) of about 100 nm is about $C_{ex}$=96%.

In one embodiment, the present invention is directed to a nano-rod light emitting diode that has quantum wells inside of it and wherein the rod-diameter of the nano-rod light emitting diode is about 200 nm or less. In one embodiment, the present invention is directed to a nano-rod light emitting diode that has quantum wells inside of it and wherein the rod-diameter of the nano-rod light emitting diode is about 150 nm or less. In one embodiment, the present invention is directed to a nano-rod light emitting diode that has quantum wells inside of it and wherein the rod-diameter of the nano-rod light emitting diode is about 100 nm or less. In one embodiment, the present invention is directed to a nano-rod light emitting diode that has quantum wells inside of it and wherein the rod-diameter of the nano-rod light emitting diode is about 50 nm or less.

Each of the applications and patents cited in this text, as well as each document or reference cited in each of the applications and patents (including during the prosecution of each issued patent; "application cited documents"), and each of the PCT and foreign applications or patents corresponding to and/or paragraphing priority from any of these applications and patents, and each of the documents cited or referenced in each of the application cited documents, are hereby expressly incorporated herein by reference. More generally, documents or references are cited in this text, either in a Reference List before the paragraphs, or in the text itself; and, each of these documents or references ("herein-cited references"), as well as each document or reference cited in each of the herein-cited references (including any manufacturer's specifications, instructions, etc.), is hereby expressly incorporated herein by reference.

EXAMPLES

The invention, having been generally described, may be more readily understood by reference to the following examples, which are included merely for purposes of illustration of certain aspects and embodiments of the present invention, and are not intended to limit the invention in any way.

The LED sample was grown on a sapphire substrate. The multi-quantum-wells consist of six periods of $In_{0.23}Ga_{0.77}N$/GaN and are sandwiched between a 125 nm p-type GaN and 4 μm n-type and un-doped GaN layers. The nano-rod LED was produced using a direct electron-beam-write method followed by metal deposition (Nickel) and lift-off processes. The nano-rod had a diameter ranging from d=50 nm-8 μm and an etch depth of ~1.4 μm. The detailed nanofabrication process is described in Huang, H. W., Kao, C. C., Hsueh, T. H., Yu, C.C., Lin, C. F., Chu, J. T., Kuo, H. C, Wang, S. C. "Fabrication of GaN-based nanorod light emitting diodes using self-assemble nickel nano-mask and inductively coupled plasma reactive ion etching." *Material science & engineering B*, 2004, 113, p. 125.

Figure 1:
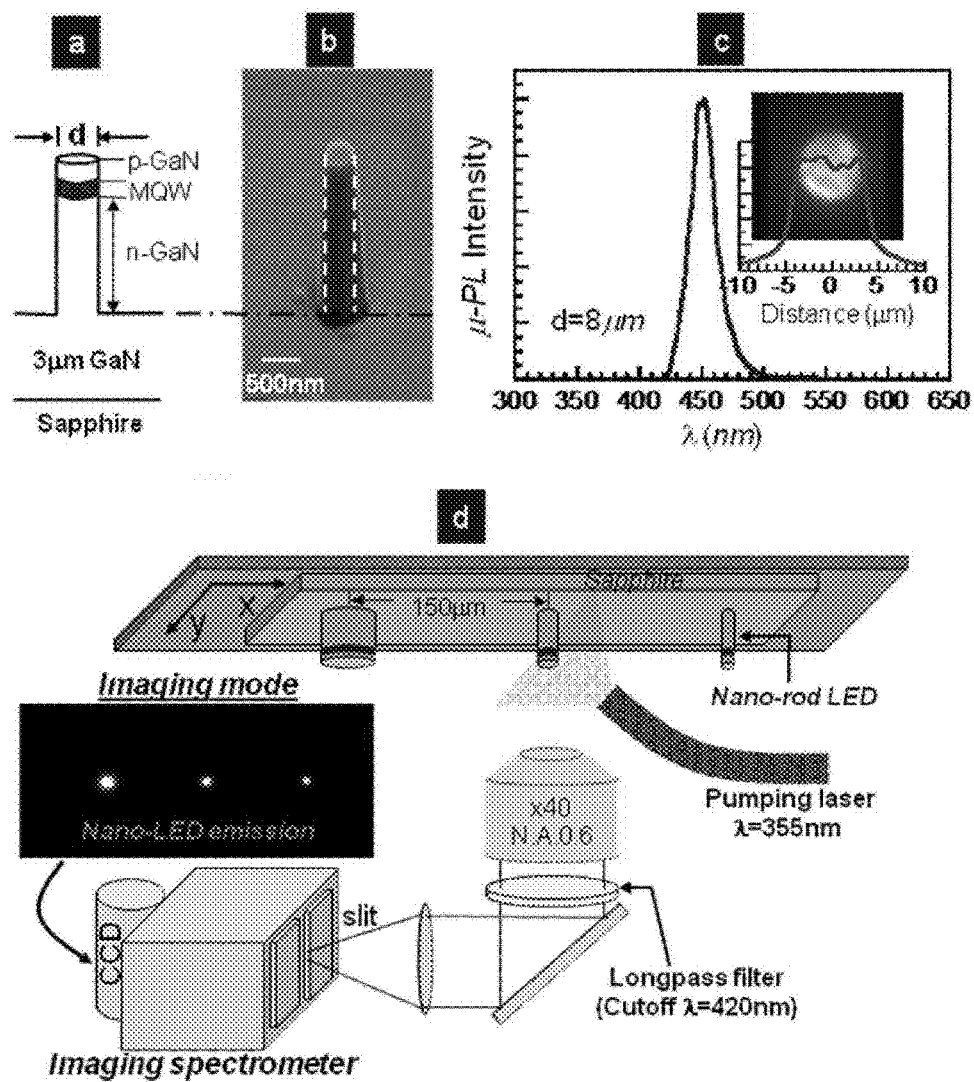
FIG. 1 shows scanning-electron-micrograph (SEM) image of a nano-rod LED and the micro-photoluminescence (μ-PL) setup. (a) A schematic of the nano-rod LED layer structure, including the multi quantum well (MQW) layer of 100 nm thick. (b) A SEM image of a fabricated nano-rod LED with a nominal rod-diameter of d=300 nm. (c) μ-PL spectrum of a nano-rod LED with d=8 μm. Inset: a CCD scan image of the same nano-LED and its intensity profile (red curve) across the center of the rod. (d) A schematic of the μ-PL and imaging measurement setup.

The GaN-based LED sample consists of a 125 nm Mg-doped p-type GaN cladding layer, six periods of $In_{0.23}Ga_{0.77}N$/GaN multi-quantum wells (MQWs) with 100 nm thickness, and a 2 μm thick n-GaN cladding layer. The bottoms of the n-type nanorods are connected to a 2 μm un-doped GaN layer grown on a sapphire substrate. A schematic of the sample structure and the cylindrical shape nano-rod LED is shown in FIG. 1(*a*). The blue line indicates the quantum-well emitter regime, which is part of the etched cylindrical rod. A scanning electron micrograph (SEM) of a fabricated nano-rod LED is shown in FIG. 1(*b*). The rod has a diameter of d=300 nm, a smooth sidewall and a slight tapering angle of ~10 degrees.

The present setup is capable of studying (1) LED emission spectrum (2) LED emission image and (3) CCD scan intensity profile. As an illustration, the inventors show, in FIG. 1(*c*), a typical testing result of a large LED with d=8 μm. In the spectroscopic mode, the μ-PL spectrum shows a peak emission at $\lambda$=460 μm. In the image mode, the recorded LED emission image from the sample's top surface is shown in the inset. The intensity profile (the red curve) across the sample displays a slightly irregular intensity across the top surface, indicating multi-mode contribution from the LED emission (Wierer, J. J., David, A., Megens, M. M. III-nitride photonic crystal light-emitting diodes with high extraction efficiency. *Nature Photonics,* 2009, 3, p. 163).

The nano-rod LED was studied and characterized using a micro-photoluminescence (μ-PL) setup with a nano-imaging capability (the image spectrometer combines with Nikon inverted research microscopy (ECLIPSE TE2000) and CCD camera (PI-Max Princeton Instrument)). The setup consists of an inverted microscope and is shown schematically in FIG. 1(*d*). To achieve optical pumping, an Nd:YAG 355 nm laser is coupled to a 50 μm diameter non-polarized fiber and is placed a few μm away from the nano-LED. To ensure an identical optical excitation, the fiber is kept fixed while a series of nano-LEDs are mounted on a moving stage for optical testing. The luminescence signal was collected by a 40× objective of 0.6 numerical aperture, passed through a $\lambda$=420 nm long pass glass filter and fed into a spectrometer with a spectral resolution of 0.17 nm and a cooled charge-coupled device (CCD) camera (PI-Max Princeton Instruments).

In one embodiment, the fabrication of the nano-rod starts with a planar LED wafer. The nano-rod pattern was defined by E-beam lithography (see top left of FIG. 6). Nickel was deposited as a mask (see dots in top left of FIG. 6), and inductively coupled plasma (ICP) etching was performed, fabricating the nano-rod, i.e. the LED under nickel dots remain and other parts are removed. Wet etching was performed to remove the Nickel on the top of the nano-rod.

In one embodiment, the sample fabrication method includes the following: the GaN-based nanorod LED was realized using a direct electron-beam-write method. The diameter of the nanorod varies from d=50 nm-8 μm and an etch depth of ~1.4 μm. After electron-beam exposure, an 80 nm nickel film was deposited. The lift-off technique was used to produce nickel dots pattern, which serve as an etching mask. Finally, the nano-rod LED sample was obtained by plasma-reactive ion etching (ICP-RIE) of GaN. The Ni mask was removed by $HNO_3$. As such, according to Applicants' teaching, the quantum wells were not placed in the nano-rod during making nano-rods, but the quantum wells were present and outside of the nano-rod was etched.

The inventors of the instant application targeted light emission from relatively small nanorods (d=50-400 nm) for further study. Modal and frequency-dispersion calculations were carried out. First, the guided mode inside such a cylindrical rod can be solved analytically. The present inventors solved guided modes inside a nanorod with diameter d and found out how many modes can exist in the nanorod. It was surprisingly found that there are hundreds of guided modes for the d=8 μm rod and that the number-of-mode is significantly reduced as the diameter of the rod is decreased to smaller and smaller still sizes.

Each mode has its own name, with $HE_{11}$ being the fundamental mode and exists in any nanorod. By reducing the diameter of the rod, the inventors eliminated all the guided modes except for $HE_{11}$ mode. It is not possible to eliminate this mode, and this $HE_{11}$ mode is actually needed. If all the modes, including the $HE_{11}$ mode, are removed, then there's nothing to emit. While there are hundreds of guided modes for the d=8 μm rod, the number-of-mode is significantly reduced as the diameter of the rod is decreased. For example, for the d=50 nm rod, the size quantization is strong enough to reduce the guide mode to only one, i.e. the fundamental $HE_{11}$ guided mode.

Figure 2:
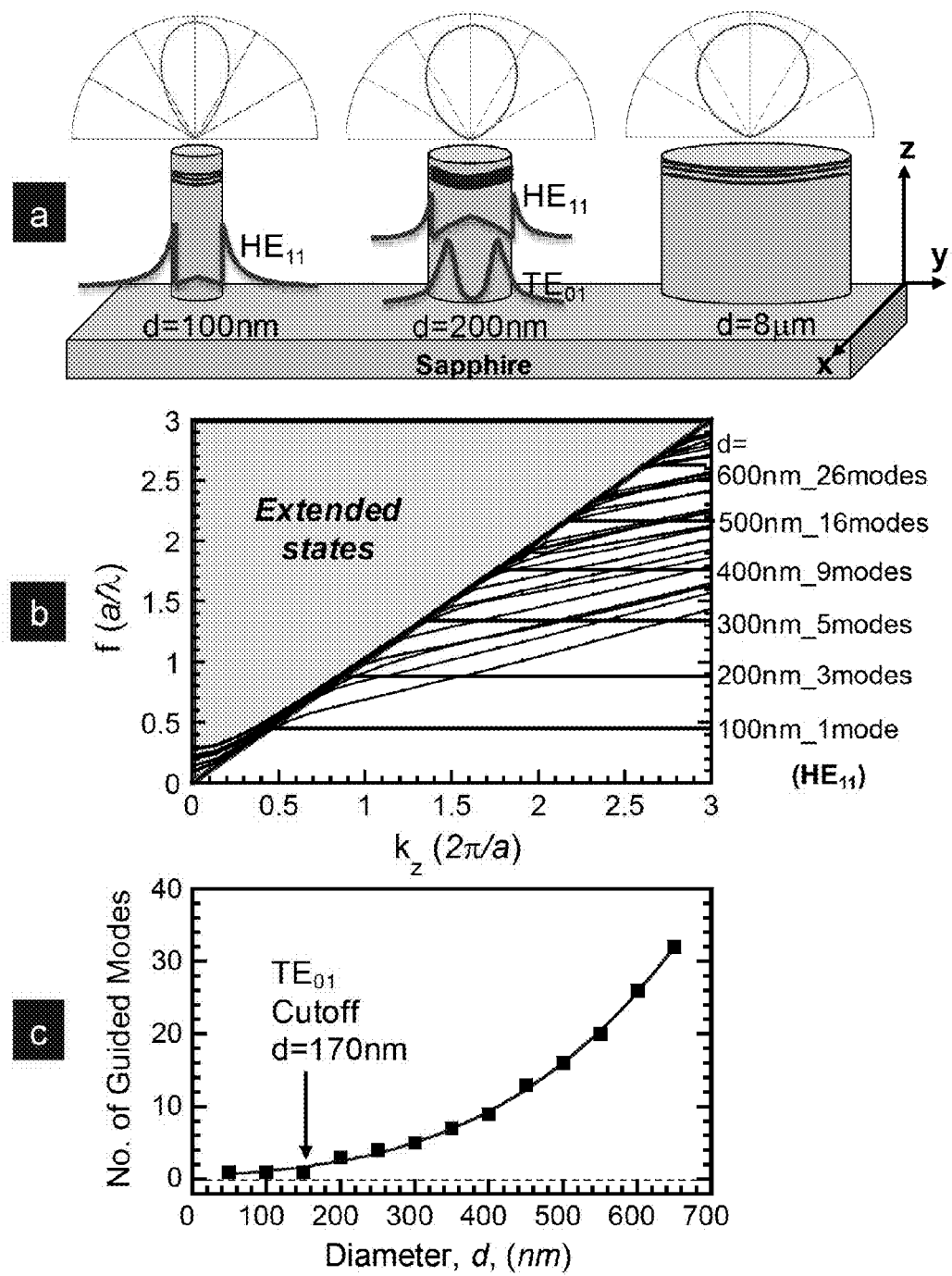
FIG. 2 shows the modal and dispersion properties of a nano-rod LED. (a) A schematic of nano-rod LED with different radiation patterns (red curves) and modal profiles (blue curves) for the fundamental $HE_{11}$ and $TE_{01}$ modes. (b) The frequency (f)-wavevector ($k_z$) diagram for cylindrical nano-rod LEDs. The horizontal lines indicate the corresponding rod diameter and the number of guided-modes inside the rod. (c) A summary of the number of guided modes inside the cylindrical rod as a function of the rod diameter.

In FIG. 2(*a*), a schematic of the fundamental $HE_{11}$ mode (blue curve) of the d=100 nm nano-rod and the first 2 modes of the d=200 nm nano-rod are shown. The lateral size-reduction not only reduced the guided mode, but also influenced the radiation pattern of an LED. As "d" was reduced to 100-200 nm, the radiation pattern showed a significant deviation from a typical strong side-emission pattern of a planar LED and became much more directional.

In FIG. 2(b), the inventors show the frequency dispersion relationship, f vs k, of the nano-rod. Here, the frequency f (a/λ) and $k_z$ (2π/a) are both expressed in a normalized unit. The red line (the straight line from bottom left corner to top right corner of graph) is the light-line that separates the guided modes from the extended states (the grey region, i.e., left of the red line). While there were 26 guided modes for the d=600 nm nano-rod, the number-of-mode was significantly reduced to three and one for the d=200 nm and 100 nm nano-rod, respectively. The number of guided mode is summarized in FIG. 2(c) as a function of d.

The data shows that the number-of-modes has a strong dependence on d and approached one for d<170 nm, i.e. the cut-off for the transverse-electric (TE) mode. This represents a nano-size regime where emitted light from the QWs has the highest probability to escape into the air. The reduction of rod-diameter can also modify an LED's radiation pattern. As "d" is reduced to 50-100 nm regime, the results show that the corresponding radiation pattern becomes more directional.

Figure 6:
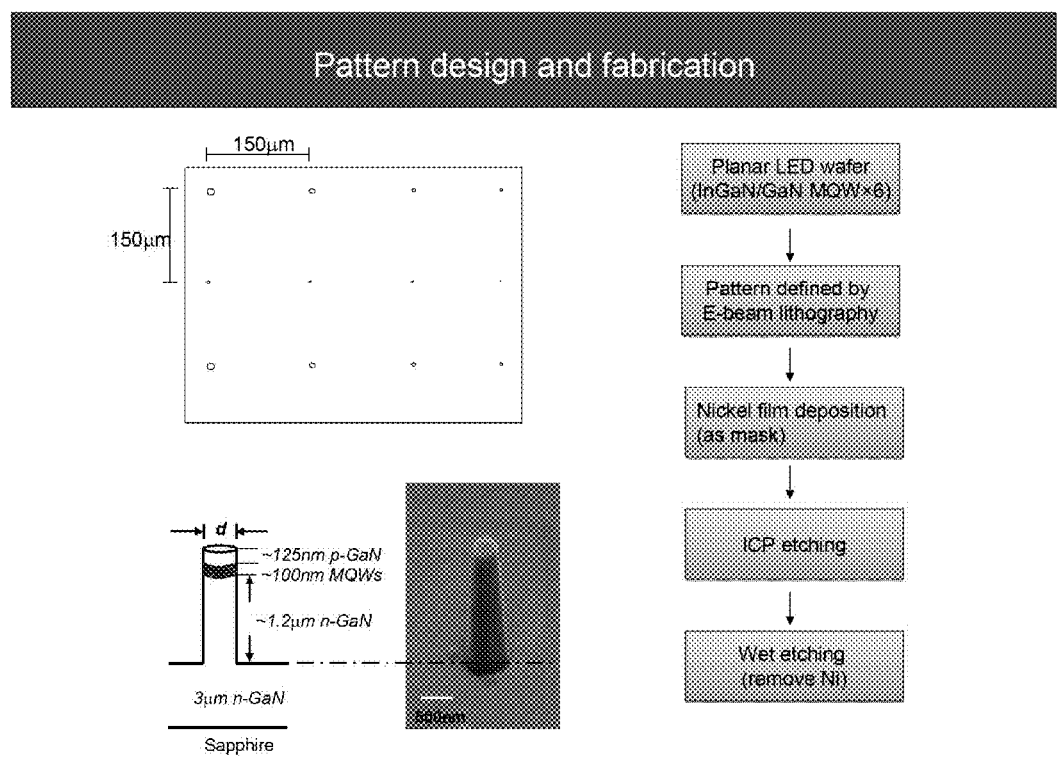

The inventors of the instant application sought to obtain a reliable emission data from a small area LED, recognizing that an important aspect of μ-PL measurement is to ensure the excitation of one single nano-rod at a time. The present application teaches that this task is accomplished by making the spacing between the adjacent nano-rod LED sufficiently wide (150 μm) and, at the same time, examining the image of the nano-rod emission for any unwanted background contribution. As shown in FIG. 6, the nano-rods are 150 μm apart.

Figure 3:
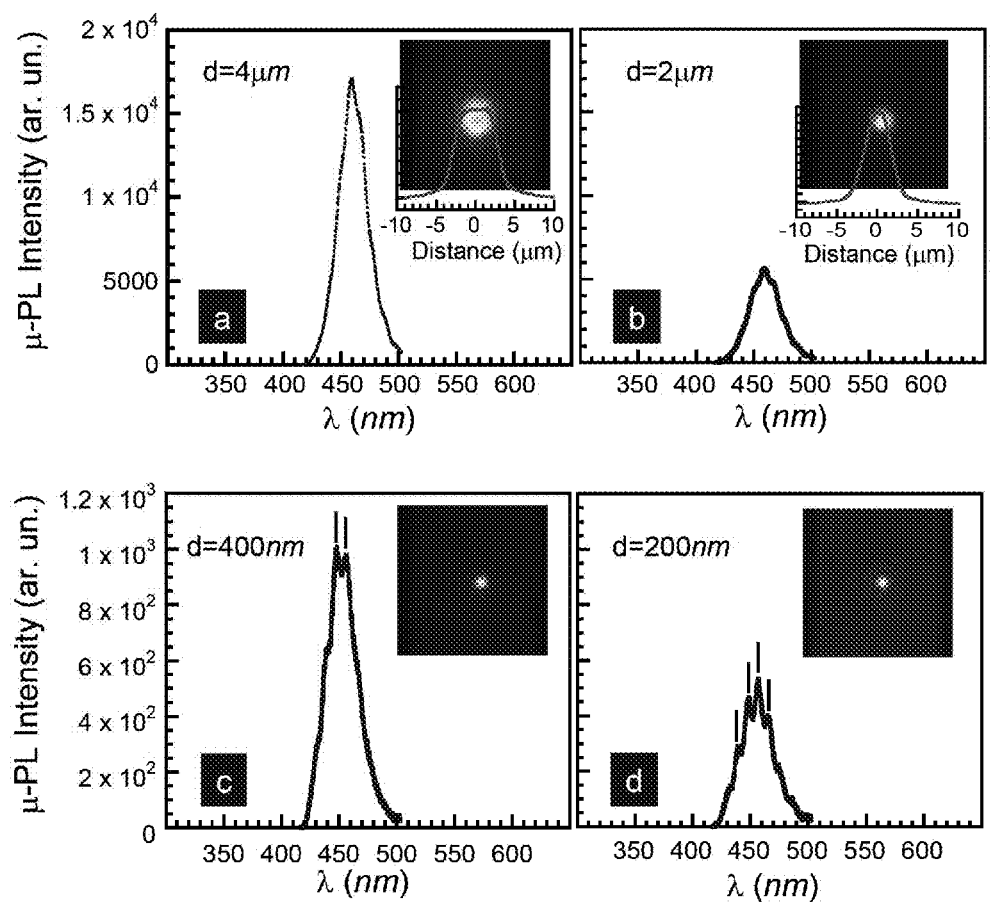
FIG. 3 shows micro-photoluminescence (μ-PL) spectra and images from four nano-rod LED devices. (a) (b) μ-PL intensity spectra of nano LEDs with a relatively large diameter, d=4 μm and 2 μm, respectively. Peak of μ-PL spectrum is at approximately 455 nm (i.e. peak emission wavelength is approximately 455 nm). Inset is the CCD image of nano-rod LED with intensity profile. The ratio of emitting area for d=2 μm to d=4 μm is $(1/2)^2 \sim 0.25$. The ratio of peak intensity is ~0.3; and (c) (d) μ-PL Intensity spectra of rod LED with d=400 nm and 200 nm, respectively. Inset is the CCD image of rod LED. The ratio of emitting area for d=200 nm to d=400 nm is $(1/2)^2 \sim 0.25$. The ratio of peak intensity is ~0.5. Light extracted from LED per emitting area is increasing as the diameter of rod LED is decreasing.

In FIG. 3, Applicants show show typical emission spectra of our nano-LEDs for four different rod-diameters, d=4 μm, 2 μm, 400 nm and 200 nm. To obtain a reliable emission data, the inventors made sure to excite one nano-LED at a time. This is achieved by making the spacing between adjacent nano-LEDs sufficiently wide (150 μm). The image of a nano-LED emission was also examined for any unwanted background contribution. In the inset of FIG. 3(a), the CCD image showed an excellent image contrast with a bright, round spot and a dark background. The intensity line-scan across the center of the rod (the red line) confirmed that the emission was from the d=4 μm nano-LED. The μ-PL data exhibited a peak at λ~460 nm and an un-normalized intensity of 17,000.

Applicants also conducted experiments and showed data for a d=2 μm nano-LED is shown in FIG. 3(b). In this image, the CCD image shows a bright spot and the line scan confirmed that the emission is from the d=2 μm nano-LED. The μ-PL showed a single peak at λ~460 nm and a weaker intensity of 5,700, a roughly 3-time reduction in μ-PL intensity. Applicants noted that as d is decreased from 4 μm to 2 μm, the LED emission-area is decreased by 4-times and so should the μ-PL intensity. This comparison of μ-PL intensity to the LED's emitting area indicated that, as d is decreased, nano-LED emission per area is enhanced.

Next, the inventors reduced the nanorod size to the sub-λ regime. In FIGS. 3(c) and (d), the inventors show data taken from nano-LEDs with d=400 nm and 200 nm, respectively. For such tiny nano-emitters, their respective CCD images are still bright and with little background noise. There was no line scan due to the finite pixel number of the emitter region. For the d=400 nm nano-LED, its μ-PL spectrum showed a slight doublet with an intensity of 1,000. For the d=200 nm nano-LED, the μ-PL spectrum showed four weak peaks with an intensity of 540.

The inventors of the instant application discovered that by reducing the rod size by a factor of 10, i.e. d=2 μm to 200 nm, the nominal emitting area is reduced by a factor of 100, and yet the μ-PL intensity is merely reduced by 11 times. The inventors discovered that there exists an extraordinarily large enhancement of μ-PL intensity per emitting area as d is reduced to a d=200 nm regime. This data is consistent with Applicants' prediction of FIG. 2(c), namely, as d is decreased, the number-of-guided modes is decreased and the efficiency of extracting light is increased accordingly.

In view of the above discovery, the inventors next carried out a more systematic study of the μ-PL intensity as a function of nano-rod diameter d. The same measurements were repeated for a series of samples with d=8 μm to 50 nm. To obtain a statistical average, Applicants measured four sets of nominally the same nano-LED devices. To obtain the total μ-PL intensity, the spectrum was integrated over λ=430-510 nm.

Figure 4:
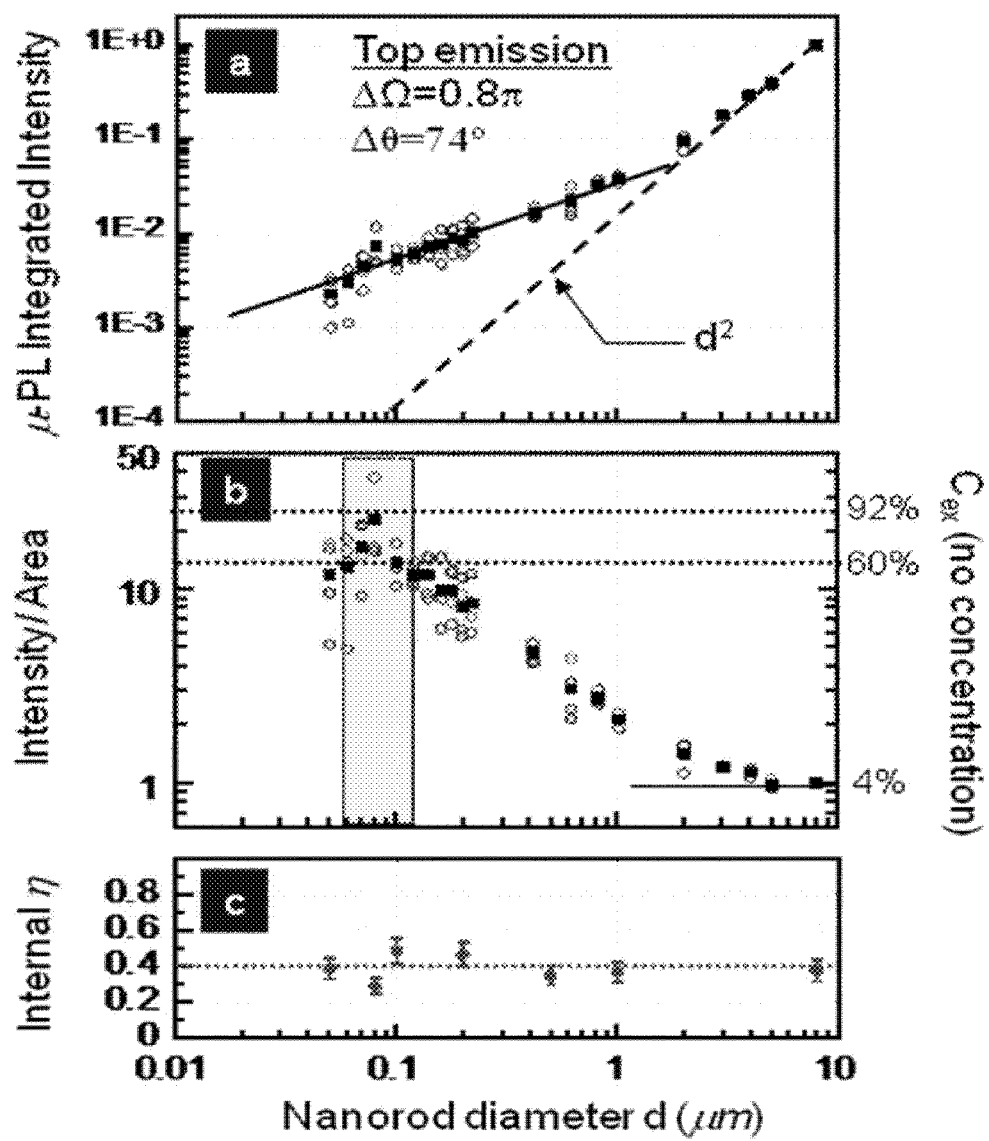
FIG. 4 shows the rod diameter-dependence of integrated μ-PL intensity, intensity/effective area and the internal quantum efficiency. (a) the integrated intensity of μ-PL spectra as a function of rod diameter d (μm). Four complete sets of nano-rod LED with d=8 μm to 50 nm were measured. Open dots of each color represent the integrated intensity of one full set of LEDs. Black square dots represent the average of four sets measurement. In this measurement, the luminescence was collected from the top emission of LED with a collection angle of $\Delta\omega=0.8\pi$. The dash line shows "$d^2$-dependence" and the solid black lines are guides to the eye, providing the guidelines which infer the intensity per emitting area is enhanced nonlinearly as the diameter is reducing. The integrated intensity is normalized to that of d=8 μm rod LED. (b) The integrated intensity per effective emitting area as a function of diameter d (μm). The intensity per effective emitting area is deduced from the integrated intensity shown in FIG. 4(a). The data is normalized to that obtained from the d=8 μm LED, which one may be considered as a planar LED with a theoretical extraction efficiency of (4±0.5)% (corresponding to the right axis). (c) The internal efficiency as a function of nano-rod diameter d. Red dash line is a guide to the eyes.

In FIG. 4(a), Applicants showed that the integrated intensity as a function d in a logarithmic plot, that is, the integrated intensity as a function d in a log-log scale for over four-order-of-magnitudes. The open dots represent the integrated intensity of one full set of nano-rod LED. Black square dots represent the average value. The data is normalized to that obtained for d=8 μm (the reference LED) and the dashed line indicates the expected "$d^2$"-dependence, expected for a linear scaling of emission intensity v.s. emitting area. For d=4-8 μm, the integrated intensity closely followed the "$d^2$"-dependence (as expected for a planar LED). However, for d=100 nm-1 μm, the intensity exhibited a significant deviation from the "$d^2$"-dependence. For example, at d=200 nm, the integrated μ-PL intensity is about twenty times higher than that expected from a simple area-scaling behavior. For d<80 nm, the integrated μ-PL intensity drops more severely as d is decreased. These results showed an unexpected and striking over an order-of-magnitude deviation from the expected $d^2$-dependence.

In this setup, the incident flux of the excitation laser is kept the same for all nano-rods and the measured μ-PL intensity can be described as: μ-PL Intensity∝$\eta_{internal}$×(emitting-area)×$C_{ex}$. Applicants recognized that if they have an accurate account of the emitting-area and the internal quantum efficiency ($\eta_{internal}$), the extraction efficiency ($C_{ex}$) can be determined.

Firstly, Applicants showed that $\eta_{internal}$ of their nano-LED is not affected significantly by the nanofabrication and etching process. To determine $\eta_{internal}$, Applicants performed temperature-dependent PL measurement of their nano-LED. The nano-LEDs were arranged in a 2×2 mm² array for ease of optical testing at cryogenic temperatures, T=4K-300K. The optical pumping was performed using a Nd:YAG 355 nm pulsed laser and the LED emission signal was collected from the top emission. From this temperature-dependent photoluminescence measurement, the inventors were able to deduce the internal quantum efficiency of the their taught nano-rod LED (see FIG. 4(c)). From this temperature-dependent measurement, $\eta_{internal}$ of the inventors' nano-LED was determined and plotted in FIG. 4(c). The data showed a slight variation of $\eta_{internal}$ as a function of d, but with an average value of $\eta_{internal}$=(40±5)% for d=50 nm-8 μm. This data showed that the etching process did not have a significant impact on internal quantum efficiency of the inventors' nano-LEDs.

Secondly, to better define the emitting-area, the inventors of the instant application take into account the slightly tapered nanorod geometry with a θ~10° tapering angle as shown in FIG. 1(b). This geometrical shape effectively increases the emitting-area due to an additional top emission from the slightly tilted sidewall near the MQW regime. From the image in FIG. 1(b), the additional emitting-area is non-negligible for d<300 nm and needs to be included to avoid an over-estimate of the μ-PL intensity per area. Accordingly, the inventors defined the effective emitting-area as: $A^{eff}=\pi \cdot ((d/2)+1/2(\Delta z \cdot \tan 10°))^2$. The second term accounts for the additional area and the Δz (=100 nm) is the MQW thickness. Thirdly, as d is varied, incident light may be reflected and absorbed differently. Applicants note that it is not easy to measure reflectivity of a nano-rod as it is less than one λ.

In FIG. 4(b), the data was plotted to show the intensity/area as a function d in a logarithmic scale. The open dots represent data taken from an individual set of nano-LEDs and the square dots are the average value. For ease of comparison, the intensity/area value is set to be one for the reference sample (d=8 μm). In other words, this is the extraction value for a large-area, planar LED and should correspond to $C_{ex}^{planar}=$ (4±0.5per surface for a Δω=2π collecting solid-angle (Phillips, J. M., Coltrin, M. E., Crawford, M. H., Fischer, A. J., Krames, M. R., Mueller-Mach, R., Mueller, G. O., Ohno, Y., Rohwer, L. E. S., Simmons, J. A., Tsao, J. Y. Research challenges to ultra-efficient inorganic solid-state lighting. *Laser&photonics reviews* 2007, 1, No 4, 307-333; and Boroditsky, M., Krauss, T. F., Coccioli, R., Vrijen, R., Bhat, R., Yablonovitch, E. light extraction from optically pumped light-emitting diode by thin-slab photonic crystals. *Applied Physics Letters.* 1999, 75, 8, p. 1036).

In the large sample regime and for nano-LEDs with d=4 μm and 8 μm, the inventors noted that the intensity/area magnitudes are the same and equal to one. As d was decreased from 2 μm to 100 nm, the intensity/area was increased monotonically. In the small diameter regime with d=60-120 nm, it reached a large value of 14-23 (the two horizontal dashed lines) for a Δω=0.8π collecting solid-angle. This data indicates the large extraction efficiency of $C_{ex}$=60%-92% in the present inventors' nano-LEDs.

PL efficiency was defined by dividing PL intensity by the corresponding excitation power by the laser for each temperature. Then the PL efficiency was normalized by the maximum value of PL efficiency at low temperature. This procedure means that the maximum value of the PL efficiency at low temperature under certain condition is equal to 100%. That is, assuming excitation input power is same for all the measurements, μ-PL Intensity ∝ (Emitting Area)×$\eta_{internal}$×$C_{extraction}$, Internal Quantum Efficiency=μ-PL Intensity at room temperature/maximum, μ-PL Intensity at low temperature. Since the emitting area and $C_{extraction}$ do not change by temperature, Internal Quantum Efficiency=$\eta_{internal\ at\ room\ temperature}/\eta_{internal\ at\ low\ temperature}$ (=1)=$\eta_{internal\ at\ room\ temperature}$.

Internal quantum efficiency, i.e. how the quantum well changes input energy to useful light, was measured. If there is low efficiency, then there will have a lot of heat and small amount of useful light. Thus, the light extraction and the internal quantum efficiency are related. The more efficient the internal quantum efficiency, the more light that can be extracted. The internal quantum efficiency of each nanorod LED was determined for comparison. There are two ways to increase the total output from an LED. One is to increase the internal quantum efficiency and the other one is to increase the extraction efficiency. The inventors increase the extraction efficiency by reducing the diameter of nano-LED. Total output energy of an LED is proportional to total input energy x internal quantum efficiency x light extraction (about 80% in one embodiment of the present invention).

The inventors of the instant application have discovered and demonstrated that it is possible to eliminate all the guided modes, except for $HE_{11}$ mode, inside a nano-rod LED and accomplish an extraction efficiency of 80% from the top surface without the use of a back reflector. If there is a back reflector, one can change the direction of the light going down inside the nanorod to the top surface. It is possible to achieve 100% efficiency. The back reflector could be a Bragg reflector or simply a coating of high reflectance metallic materials such as silver or aluminum. The inventors of the instant application surprisingly discovered that it is important to place the quantum wells inside the nano-rod (an imbedded emitter) and to reduce the rod-diameter to a sub-λ confinement regime. From a model calculation, the criterion for achieving the desired confinement of a nanorod LED is d/λ≤0.20.

Furthermore, the inventors of the instant application discovered and demonstrated that a nano-rod LED offered a means to control the radiation pattern of LED emission. For example, as shown in FIG. 5(b), the radiation pattern is different from the Lambertian pattern that a normal LED shows. In the present invention, the radiation pattern shows a narrower and more directional pattern.

The application of this technology would be apparent to one of skill in the art. For example, the high Efficiency LED of the presently taught invention will allow less energy to be used for general lighting purposes. Furthermore, the surprising discovery that the nan-rod LED of the presently taught invention has a narrow and directional beam is important and preferred for applications and devices including projectors, search lights, head lights of vehicles, and the like.

The inventors of the instant application also discovered that one important consequence of a nano-LED in the sub-λ regime concerns the modification of its radiation pattern. The influence of lateral size-reduction on the angular distribution of a nano-LED emission was examined next. In FIG. 5(a), the inventors' results showed a FDTD field profile calculation of a nanorod with d=100 nm or d/λ≈0.20. Inside the nanorod, electromagnetic wave (EM) propagates along the z-direction into the substrate with a well-defined phase front. The top emission into the air also shows a more collimated propagation along the z-direction. To confirm this, the inventors of the instant application measured radiation pattern of a nano-LED with d=100 nm. Due to instrumentation limitation, the angular-dependent measurement was performed on a square array of nano-LED sample with a lattice constant of 400 nm and an array size of 2×2 mm².

The inventors note that, for a planar LED, the maximum extraction efficiency can only be $C_{ex}$=50% from the top surface. Applicants note that from FIG. 5(a) that the EM field intensity exhibited a stronger forward emission. For comparison purpose, the intensity profile for a planar LED is shown in FIG. 5(b). It shows a significantly stronger backward emission than forward emission. The preferred forward light propagation for the d=100 nm nano-LED is one of the factors for the observed, large $C_{ex}$=79%. The inventors further point out that, even at d=100 nm, there is one $HE_{11}$ guided mode left (as shown in FIG. 2b) to trap light inside the GaN sample.

In FIG. 5(c), the inventors show the measured (red outer dots forming oval shape) and the computational (black inner dots forming narrower oval shape) results. The radiation did not follow either a strong side emission pattern of a planar LED or the Lambertian pattern. Instead, its angular extend was narrower and it was more directional with a half-power point at θ=35°. Consequently, the inventors have surprisingly discovered that a nano-rod LED offers a new degree of freedom for controlling the radiation pattern of LED emission. The EM field also exhibited a stronger forward emission. Taking this experimentally observed angular-concentration effect into account, in one embodiment, the inventors found that the maximum extraction efficiency at rod diameter (d) of about 100 nm is from about $C_{ex}$=79% to about $C_{ex}$=92%. As such, the inventors surprisingly discovered that, a nano-LED not only offers a new way to enhance light extraction, but also a new degree-of-freedom to tailor LED's radiation pattern.

Calculating the transmission, reflection and scattering loss of a nano-rod LED. The inventors of the instant application examined the optical scattering properties of guided modes under sub-λ confinement in order to understand this unusually high extraction efficiency of their nano-LED for d≤120 nm. A full-vector Maxwell equation solver, the so called, Cavity Modeling Framework (CAMFR), was used to calculate the transmission, reflection and radiation loss of Applicants' cylindrical, nano-rod LED. Briefly, it was based on a frequency-domain Eigen mode expansion method. In the instant application, the inventors also implemented a supercell approach in cylindrical coordinates and Perfectly-Matched-Layer boundary condition to avoid parasitic reflections.

The inventors of the instant application examined the optical scattering properties of guided modes under sub-λ confinement in order to understand this unusually high extraction efficiency of their nano-LED for d≤120 nm. FIG. 5(d) shows transmittance, reflectance and radiation amplitude vs. the normalized diameter, (d/λ) computed for the fundamental $HE_{11}$ mode. For d/λ≥0.5, the transmittance was low (~0.15), the reflectance was low (~0.15) and the radiation loss was high (~0.70). This is the large nano-rod regime where light can not be efficiently coupled to the air. However, for d/λ≤0.22, the reflectance was close to zero, the radiation loss was low and the transmittance was high (>0.85). A $HE_{11}$ mode profile with E-field lines was also shown. This is the small nano-rod regime where light in the $HE_{11}$ mode can be easily out-coupled into the air. For the inventors' nano-LED, it emitted at λ=460 nm and the condition was satisfied for d≤100 nm. This unique optical property for nano-scale rod holds true for higher order modes as well.

This highly unusual optical property at sub-λ holds true for higher order modes as well. In FIG. 5(e), the inventors show results for the lowest order $TE_{01}$ mode. In particular, in FIG. 5(e) the inventors showed the averaged transmittance, reflectance and scattering amplitude calculated for the fundamental, first and second order modes that are TE-like. The data showed a similar trend as that for the fundamental $HE_{11}$ mode. In this case, for d/λ≤0.30, the reflectance was close to zero and the transmittance was near unity. In this deep sub-λ confinement regime, light transmission becomes very efficient and little light emission would be trapped. From this analysis, the Applicants deduced that one of the factors for achieving high extraction efficiency is an ultra efficient light out-coupling of $HE_{11}$ and $TE_{01}$ modes. Applicants discovered that it is in this sub-λ regime, e.g. d/λ≤0.20, where the challenge of light trapping can be completely resolved.

All publications, patents, and patent applications mentioned herein are hereby incorporated by reference in their entirety as if each individual publication or patent was specifically and individually indicated to be incorporated by reference. In case of conflict, the present application, including any definitions herein, will control. While several aspects of the present invention have been described and depicted herein, alternative aspects may be effected by those skilled in the art to accomplish the same objectives. Those skilled in the art will recognize, or be able to ascertain using no more than routine experimentation, many equivalents to the specific embodiments of the invention described herein. Accordingly, it is intended by the appended claims to cover all such alternative aspects as fall within the true spirit and scope of the invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

The invention claimed is:

1. A method for improving light emitting diode (LED) extraction efficiency, said method comprising:
    (a) providing a nano-rod light emitting diode comprising a nano-rod;
    (b) providing quantum wells having a quantum-well plane (x and y); and
    (c) reducing diameter of the nano-rod of said nano-rod LED laterally in the quantum-well plane (x and y), thereby improving LED extraction efficiency.

2. The method of claim 1, wherein the extraction efficiency achieved is from about 60% to about 100%.

3. The method of claim 1, wherein the rod diameter of the nano-rod light emitting diode is reduced to about 200 nm and a number of guided modes is 3.

4. The method of claim 1, wherein the radiation pattern of the LED becomes more directional when compared to a standard LED.

5. The method of claim 1, wherein the quantum wells are placed inside the nano-rod.

6. The method of claim 1, wherein all of the guided modes inside of said nano-rod light emitting diode are eliminated, except for $HE_{11}$.

7. The method of claim 1, wherein said method comprises eliminating the guided modes, except for the $HE_{11}$ mode, inside the nano-rod light emitting diode.

8. The method of claim 1, wherein the rod-diameter is reduced to a sub-λ confinement regime.

9. The method of claim 1, wherein the light emitting diode's radiation pattern is modified, such that the radiation pattern does not follow the Lambertian pattern of a normal LED, and its angular extend is narrower with a half-power point at θ=35°.

10. A nano-rod light emitting diode that has quantum wells inside of it and wherein rod-diameter of the nano-rod light emitting diode is about 200 nm and a number of guided modes is 3.

11. The nano-rod LED of claim 10, wherein the radiation pattern of the LED is more directional when compared to a standard LED.

12. A method for making a nano-rod LED that is reduced in size laterally in a quantum-well plane (x and y), said method comprising:
    (a) quantizing guided modes of the nano-rod LED;
    (b) defining nano-rod pattern by E-beam lithography;
    (c) depositing Nickel;
    (d) performing inductively coupled plasma etching; and
    (e) removing Nickel.

* * * * *